US011049570B2

(12) United States Patent
Gupta et al.

(10) Patent No.: US 11,049,570 B2
(45) Date of Patent: Jun. 29, 2021

(54) DYNAMIC WRITES-PER-DAY ADJUSTMENT FOR STORAGE DRIVES

(71) Applicant: International Business Machines Corporation, Armonk, NY (US)

(72) Inventors: Lokesh M. Gupta, Tucson, AZ (US); Matthew G. Borlick, Tucson, AZ (US); Karl A. Nielsen, Tucson, AZ (US); Micah Robison, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/454,042

(22) Filed: Jun. 26, 2019

(65) Prior Publication Data

US 2020/0411111 A1 Dec. 31, 2020

(51) Int. Cl.
*G06F 3/06* (2006.01)
*G11C 16/26* (2006.01)

(52) U.S. Cl.
CPC ............ *G11C 16/26* (2013.01); *G06F 3/061* (2013.01); *G06F 3/0616* (2013.01); *G06F 3/0653* (2013.01); *G06F 3/0689* (2013.01)

(58) Field of Classification Search
CPC ...... G06F 3/061; G06F 3/0653; G06F 3/0683; G06F 3/0616
See application file for complete search history.

(56) References Cited

U.S. PATENT DOCUMENTS

| 7,970,974 | B2 | 6/2011 | Chen et al. |
| 8,898,548 | B1 | 11/2014 | Mullendore et al. |
| 9,054,992 | B2 | 6/2015 | Wright et al. |
| 9,235,486 | B1 | 1/2016 | Casaburi et al. |

(Continued)

FOREIGN PATENT DOCUMENTS

| CN | 107515731 A | 12/2017 |
| WO | WO2007112555 A1 | 10/2007 |

(Continued)

OTHER PUBLICATIONS

List of IBM Patents or Patent Applications Treated as Related.
(Continued)

*Primary Examiner* — Ryan Bertram
*Assistant Examiner* — Edmund H Kwong
(74) *Attorney, Agent, or Firm* — Nelson and Nelson; Daniel P. Nelson

(57) ABSTRACT

A method for dynamically altering a writes-per-day classification of multiple storage drives is disclosed. In one embodiment, such a method monitors, within a storage environment, an amount of overprovisioning utilized by multiple storage drives. Each storage drive has a writes-per-day classification associated therewith. Based on the amount of overprovisioning, the method periodically modifies the writes-per-day classification of the storage drives. The method then reorganizes the storage drives within various storage groups (e.g., RAID arrays, storage tiers, workloads, etc.) based on their writes-per-day classification. For example, the method may place, as much as possible, storage drives of the same writes-per-day classification within the same storage groups. A corresponding system and computer program product are also disclosed.

20 Claims, 13 Drawing Sheets

(56) References Cited

U.S. PATENT DOCUMENTS

| | | | |
|---|---|---|---|
| 9,639,282 | B2 | 5/2017 | Kankani et al. |
| 9,652,352 | B1 | 5/2017 | Chilton et al. |
| 9,705,819 | B1 | 7/2017 | Manden et al. |
| 9,747,034 | B2 | 8/2017 | Clark et al. |
| 9,818,476 | B1 | 11/2017 | Ballapuram |
| 9,830,107 | B2 | 11/2017 | Blount |
| 9,842,060 | B1 | 12/2017 | Jannyavula Venkata et al. |
| 9,846,541 | B2 | 12/2017 | Miyamoto et al. |
| 9,921,912 | B1 | 3/2018 | Vankamamidi et al. |
| 10,101,947 | B2 | 10/2018 | Hong et al. |
| 10,191,773 | B2 | 1/2019 | Wires et al. |
| 10,268,390 | B2 | 4/2019 | Warfield et al. |
| 2012/0303873 | A1 | 11/2012 | Nguyen |
| 2013/0124787 | A1 | 5/2013 | Schuette |
| 2014/0052925 | A1* | 2/2014 | Kotzur ............... G06F 12/0246 711/136 |
| 2014/0089582 | A1 | 3/2014 | Kobayashi |
| 2015/0106578 | A1 | 4/2015 | Warfield et al. |
| 2015/0220272 | A1 | 8/2015 | Bachar et al. |
| 2016/0117104 | A1 | 4/2016 | Hashimoto |
| 2016/0328179 | A1 | 11/2016 | Quinn |
| 2017/0060442 | A1 | 3/2017 | Dunn |
| 2017/0068457 | A1 | 3/2017 | Sunaga |
| 2017/0097781 | A1* | 4/2017 | Reimers ............... G11C 16/349 |
| 2017/0147436 | A1 | 5/2017 | Borlick et al. |
| 2017/0269996 | A1 | 9/2017 | Shono et al. |
| 2017/0277629 | A1 | 9/2017 | Li |
| 2017/0285972 | A1 | 10/2017 | Dalmatov |
| 2018/0067660 | A1 | 3/2018 | Yamamoto |
| 2018/0095662 | A1 | 4/2018 | Brennan et al. |
| 2018/0188979 | A1 | 7/2018 | Shu et al. |
| 2018/0284997 | A1* | 10/2018 | Dalmatov ............. G06F 3/0616 |
| 2018/0351582 | A1 | 12/2018 | Canepa |
| 2019/0004899 | A1 | 1/2019 | Gao et al. |
| 2019/0042126 | A1* | 2/2019 | Sen ........................ G06F 9/5088 |
| 2019/0108888 | A1 | 4/2019 | Sarkar et al. |
| 2019/0243567 | A1* | 8/2019 | Kankani ............... G06F 3/0632 |
| 2019/0278498 | A1* | 9/2019 | Dedrick ............... G06F 3/0631 |
| 2020/0042208 | A1 | 2/2020 | Roberts |

FOREIGN PATENT DOCUMENTS

| | | |
|---|---|---|
| WO | WO2014105228 A1 | 7/2014 |
| WO | WO2018004368 A1 | 1/2018 |

OTHER PUBLICATIONS

Fujitsu, "Fujitsu Primergy Servers Solid State Drives—FAQ," White Paper, available at http://ts.fujitsu.com/primergy, Mar. 31, 2014.

Darwin, Cosmos, "Understanding SSD endurance: drive writes per day (DWPD), terabytes written (TBW), and the minimum recommended for . . . ," available at https://techcommunity.microsoft.com/t5/Storage-at-Microsoft/Unders...ding-SSD-endurance-drive-writes-per-day-DWPD-terabytes/ba-p/426024, Aug. 11, 2017.

International Searching Authority, International Search Report and Written Opinion, dated Sep. 27, 2020.

International Searching Authority, International Search Report and Written Opinion, dated Sep. 29, 2020.

International Searching Authority, International Search Report and Written Opinion, dated Sep. 16, 2020.

\* cited by examiner

DYNAMIC WRITES-PER-DAY ADJUSTMENT FOR STORAGE DRIVES

BACKGROUND

Field of the Invention

This invention relates to systems and methods to dynamically compensate for age and/or wear on storage drives.

Background of the Invention

A RAID (i.e., a Redundant Array of Independent Disks) is a storage technology that provides increased storage functions and reliability through redundancy. A RAID is created by combining multiple storage drive components (e.g., disk drives and/or solid state drives) into a logical unit. Data is then distributed across the drives using various techniques, referred to as "RAID levels." The standard RAID levels, which currently include RAID levels 1 through 6, are a basic set of RAID configurations that employ striping, mirroring, and/or parity to provide data redundancy. Each of the configurations provides a balance between two key goals: (1) increasing data reliability and (2) increasing I/O performance.

When storage drives in a RAID are new, the storage drives may have certain performance characteristics or specifications. These characteristics or specifications may be expressed in terms of a performance class, writes-per-day classification, storage capacity, amount of over-provisioning, or the like. Nevertheless, as the storage drives age and wear out, the storage drives may be unable to provide the same performance characteristics or specifications that they were able to provide when new. This may make the storage drives unsuitable for use in certain RAID arrays, storage tiers, or workloads, which may have certain performance requirements. If the wear or age of the storage drives is ignored and the same workload is driven to these storage drives regardless of their age and/or wear, the storage drives may exhibit excessively high failure rates and/or reduced life cycles.

In view of the foregoing, what are needed are systems and methods to dynamically compensate for age and/or wear on storage drives. Ideally, such systems and methods will, based on the age and/or wear of the storage drives, periodically reassign the storage drives to appropriate RAID arrays, storage tiers, or workloads. Such systems and methods will also ideally reduce failure rates and increase the useful life of the storage drives.

SUMMARY

The invention has been developed in response to the present state of the art and, in particular, in response to the problems and needs in the art that have not yet been fully solved by currently available systems and methods. Accordingly, embodiments of the invention have been developed to dynamically compensate for age and/or wear on storage drives. The features and advantages of the invention will become more fully apparent from the following description and appended claims, or may be learned by practice of the invention as set forth hereinafter.

Consistent with the foregoing, a method for dynamically altering a writes-per-day classification of multiple storage drives is disclosed. In one embodiment, such a method monitors, within a storage environment, an amount of over-provisioning utilized by multiple storage drives. Each storage drive has a writes-per-day classification associated therewith. Based on the amount of overprovisioning, the method periodically modifies the writes-per-day classification of the storage drives. The method then reorganizes the storage drives within various storage groups (e.g., RAID arrays, storage tiers, workloads, etc.) based on their writes-per-day classification. For example, the method may place, as much as possible, storage drives of the same writes-per-day classification within the same storage groups.

A corresponding system and computer program product are also disclosed and claimed herein.

BRIEF DESCRIPTION OF THE DRAWINGS

In order that the advantages of the invention will be readily understood, a more particular description of the invention briefly described above will be rendered by reference to specific embodiments illustrated in the appended drawings. Understanding that these drawings depict only typical embodiments of the invention and are not therefore to be considered limiting of its scope, the invention will be described and explained with additional specificity and detail through use of the accompanying drawings, in which.

DETAILED DESCRIPTION

Figure 1:
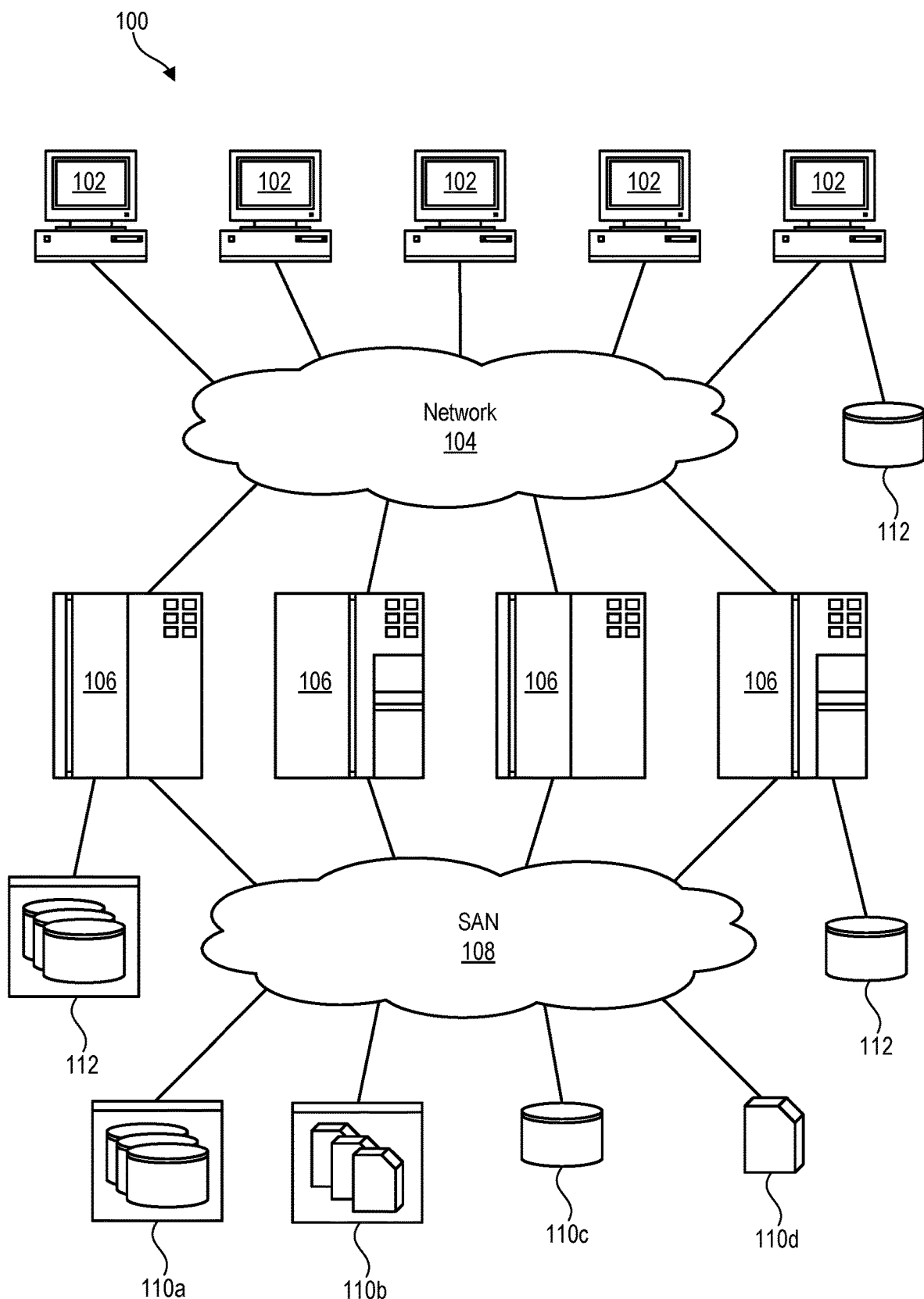
FIG. 1 is a high-level block diagram showing one example of a network environment in which systems and methods in accordance with the invention may be implemented.

It will be readily understood that the components of the present invention, as generally described and illustrated in the Figures herein, could be arranged and designed in a wide variety of different configurations. Thus, the following more detailed description of the embodiments of the invention, as represented in the Figures, is not intended to limit the scope of the invention, as claimed, but is merely representative of certain examples of presently contemplated embodiments in accordance with the invention. The presently described embodiments will be best understood by reference to the drawings, wherein like parts are designated by like numerals throughout.

The present invention may be embodied as a system, method, and/or computer program product. The computer program product may include a computer readable storage medium (or media) having computer readable program instructions thereon for causing a processor to carry out aspects of the present invention.

The computer readable storage medium may be a tangible device that can retain and store instructions for use by an instruction execution device. The computer readable storage medium may be, for example, but is not limited to, an electronic storage system, a magnetic storage system, an optical storage system, an electromagnetic storage system, a semiconductor storage system, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage system via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages.

The computer readable program instructions may execute entirely on a user's computer, partly on a user's computer, as a stand-alone software package, partly on a user's computer and partly on a remote computer, or entirely on a remote computer or server. In the latter scenario, a remote computer may be connected to a user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention may be described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, may be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus, or other device to produce a computer implemented process, such that the instructions which execute on the computer, other programmable apparatus, or other device implement the functions/acts specified in the flowchart and/or block diagram block or blocks.

Referring to FIG. 1, one example of a network environment 100 is illustrated. The network environment 100 is presented to show one example of an environment where systems and methods in accordance with the invention may be implemented. The network environment 100 is presented by way of example and not limitation. Indeed, the systems and methods disclosed herein may be applicable to a wide variety of different network environments in addition to the network environment 100 shown.

As shown, the network environment 100 includes one or more computers 102, 106 interconnected by a network 104. The network 104 may include, for example, a local-area-network (LAN) 104, a wide-area-network (WAN) 104, the Internet 104, an intranet 104, or the like. In certain embodiments, the computers 102, 106 may include both client computers 102 and server computers 106 (also referred to herein as "hosts" 106 or "host systems" 106). In general, the client computers 102 initiate communication sessions, whereas the server computers 106 wait for and respond to requests from the client computers 102. In certain embodiments, the computers 102 and/or servers 106 may connect to one or more internal or external direct-attached storage systems 112 (e.g., arrays of hard-storage drives, solid-state drives, tape drives, etc.). These computers 102, 106 and direct-attached storage systems 112 may communicate using protocols such as ATA, SATA, SCSI, SAS, Fibre Channel, or the like.

The network environment 100 may, in certain embodiments, include a storage network 108 behind the servers 106, such as a storage-area-network (SAN) 108 or a LAN 108 (e.g., when using network-attached storage). This network 108 may connect the servers 106 to one or more storage systems 110, such as arrays 110a of hard-disk drives or solid-state drives, tape libraries 110b, individual hard-disk drives 110c or solid-state drives 110c, tape drives 110d, CD-ROM libraries, or the like. To access a storage system 110, a host system 106 may communicate over physical connections from one or more ports on the host 106 to one or more ports on the storage system 110. A connection may be through a switch, fabric, direct connection, or the like. In certain embodiments, the servers 106 and storage systems 110 may communicate using a networking standard such as Fibre Channel (FC) or iSCSI.

Figure 2:
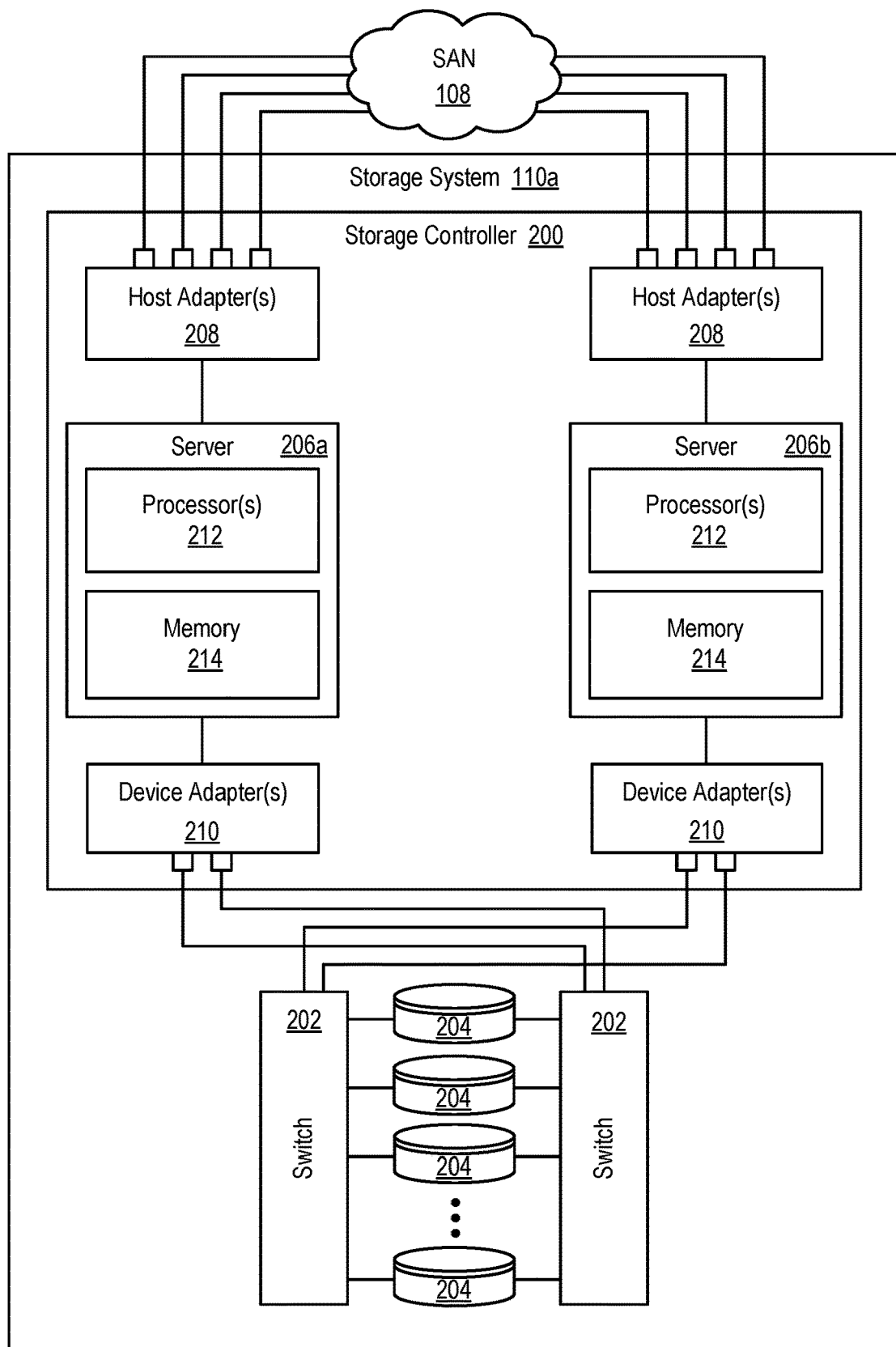
FIG. 2 is a high-level block diagram showing one embodiment of a storage system in which one or more RAIDs or storage tiers may be implemented.

Referring to FIG. 2, one example of a storage system 110a containing an array of hard-disk drives 204 and/or solid-state drives 204 is illustrated. The internal components of the storage system 110a are shown since RAID arrays may, in certain embodiments, be implemented all or partly within such a storage system 110a. As shown, the storage system 110a includes a storage controller 200, one or more switches 202, and one or more storage drives 204, such as hard-disk drives 204 and/or solid-state drives 204 (e.g., flash-memory-based drives 204). The storage controller 200 may enable one or more host systems 106 (e.g., open system and/or mainframe servers 106 running operating systems such z/OS, zVM, or the like) to access data in the one or more storage drives 204.

In selected embodiments, the storage controller 200 includes one or more servers 206a, 206b. The storage controller 200 may also include host adapters 208 and device adapters 210 to connect the storage controller 200 to host systems 106 and storage drives 204, respectively. Multiple servers 206a, 206b may provide redundancy to ensure that data is always available to connected host systems 106. Thus, when one server 206a fails, the other server 206b may pick up the I/O load of the failed server 206a to ensure that I/O is able to continue between the host systems 106 and the storage drives 204. This process may be referred to as a "failover."

In selected embodiments, each server 206 includes one or more processors 212 and memory 214. The memory 214 may include volatile memory (e.g., RAM) as well as non-volatile memory (e.g., ROM, EPROM, EEPROM, hard disks, flash memory, etc.). The volatile and non-volatile memory may, in certain embodiments, store software modules that run on the processor(s) 212 and are used to access data in the storage drives 204. These software modules may manage all read and write requests to logical volumes in the storage drives 204.

One example of a storage system 110a having an architecture similar to that illustrated in FIG. 2 is the IBM DS8000™ enterprise storage system. The DS8000™ is a high-performance, high-capacity storage controller providing disk and solid-state storage that is designed to support continuous operations. Nevertheless, the techniques disclosed herein are not limited to the IBM DS8000™ enterprise storage system 110a, but may be implemented in any comparable or analogous storage system 110, regardless of the manufacturer, product name, or components or component names associated with the system 110. Any storage system that could benefit from one or more embodiments of the invention is deemed to fall within the scope of the invention. Thus, the IBM DS8000™ is presented only by way of example and not limitation.

Figure 3:
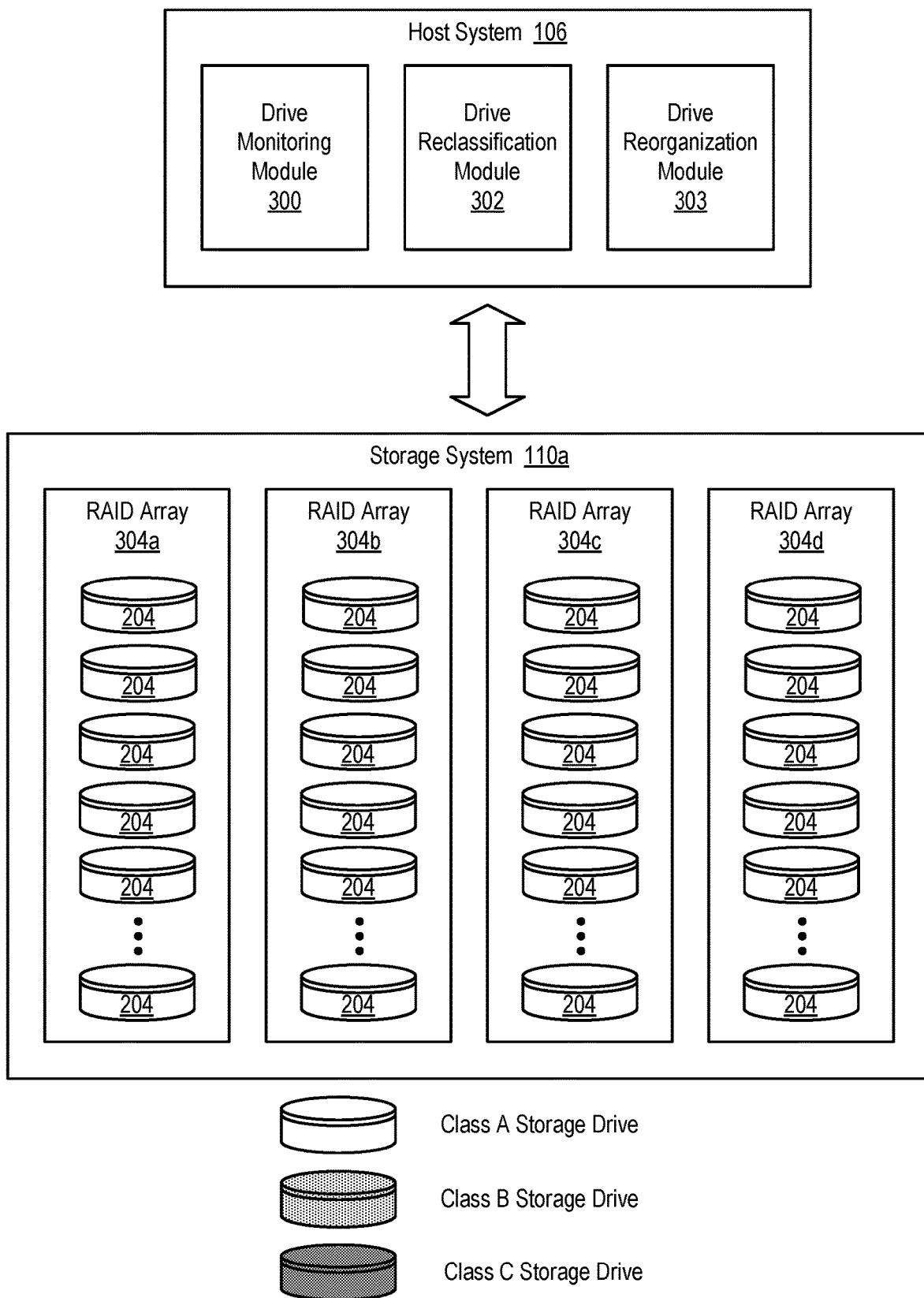
FIG. 3 is a high-level block diagram showing various storage drives and their associated performance class when new.

Referring to FIG. 3, in certain embodiments, storage drives 204 of the storage system 110a may be configured in one or more RAID arrays 304 to provide desired levels of reliability and/or I/O performance. A RAID array 304 is created by combining multiple storage drive components (e.g., disk drives 204 and/or solid state drives 204) into a logical unit. Data is then distributed across the drives using various techniques, referred to as "RAID levels." The standard RAID levels, which currently include RAID levels 1 through 6, are a basic set of RAID configurations that employ striping, mirroring, and/or parity to provide data redundancy. Each of the configurations provides a balance between two key goals: (1) increasing data reliability and (2) increasing I/O performance.

When storage drives 204 in a RAID array 304 are new, the storage drives 204 may have certain performance characteristics or specifications. These characteristics or specifications may be expressed in terms of a performance class, writes-per-day classification, storage capacity, amount of over-provisioning, or the like. Nevertheless, as the storage drives 204 age and wear out, the storage drives 204 may be unable to provide the same performance characteristics or specifications that they were able to provide when new. This may make the storage drives 204 unsuitable for use in certain RAID arrays 304, storage tiers, or workloads, which may have certain performance requirements. If the wear or age of the storage drives 204 is ignored and the same workload is driven to these storage drives 204 regardless of their age and/or wear, the storage drives 204 may exhibit excessively high failure rates and/or reduced life cycles.

Thus, systems and methods are needed to dynamically compensate for age and/or wear on storage drives 204. Ideally, such systems and methods will, based on the age and/or wear of the storage drives 204, periodically reassign the storage drives 204 to appropriate RAID arrays 304, storage tiers, or workloads. Such systems and methods will also ideally reduce failure rates and increase the useful life of the storage drives 204.

As shown in FIG. 3, when storage drives 204 are new, the new storage drives 204 may have a certain performance class associated therewith. For example, the storage drives 204 have be assigned performance class A, B, or C, where the performance class A has better performance (e.g., I/O performance) than the performance class B, and the performance class B has better performance than the performance class C. In the illustrated embodiment, each of the RAID arrays 304 start with storage drives 204 of the same performance class (in this example, performance class A) although this is not necessary in all embodiments. For example, some RAID arrays 304 may be assigned storage drives 204 of a lesser performance class (e.g., performance class B or C) depending on the performance requirements of the RAID array 304.

Over time, due to failures and replacement of certain storage drives 204 within the RAID arrays 304, the RAID arrays 304 may be made up of storage drives 204 having different age and/or wear characteristics. Nevertheless, as the storage drives 204 age and wear out, the storage drives 204 may be unable to provide the same performance characteristics or specifications, or be unable to do so without exhibiting higher than acceptable failure rates or a reduced life cycle. Nevertheless, as the storage drives 204 of a certain performance class age and/or wear out, the storage drives 204 may continue to be used in the same way as result of their initially assigned performance class.

In certain embodiments, systems and methods in accordance with the invention may monitor characteristics (e.g., age and/or wear) of storage drives 204 in a storage environment and periodically reclassify the storage drives 204 with an appropriate performance class. For example, for storage drives 204 with an expected life of three years, the storage drives 204 may initially be assigned performance class A. After the first year of use, the storage drives 204 may be reduced to performance class B. After the second year of use, the storage drives 204 may be reduced to performance class C. Each time the storage drives 204 are assigned a new performance class, the storage drives 204 may, if not already, be placed in appropriate storage groups (e.g., RAID arrays 304, storage tiers in a tiered storage environment, storage drives 204 with particular workload requirements, etc.). This may be accomplished by swapping, in a storage environment, storage drives 204 of a certain performance class with storage drives 204 of a different performance class so that storage groups (e.g., RAID arrays 304, storage tiers, workloads, etc.) contain, as much as possible, storage drives 204 of the same performance class.

As shown in FIG. 3, in certain embodiments, one or more modules 300, 302, 303, may be used to provide various features and functions in accordance with the invention. For example, a drive monitoring module 300 may be configured to monitor storage drive characteristics, such as storage drive age, use, and/or wear. A drive reclassification module 302, by contrast, may be configured to periodically reclassify storage drives 204 in accordance with their characteristics. For example, the drive reclassification module 302 may reduce the performance class of a storage drive 204 as it ages or wears out. Once the storage drives 204 are reclassified, the drive reorganization module 303 may be configured to reorganize the storage drive 204 in the storage environment in accordance with their classification. For example, in certain embodiments, the drive reorganization module 303 may place, as much as possible, storage drives 204 of the same performance class in the same storage groups, such as in the same RAID arrays 304 or the same storage tiers.

Figure 4:
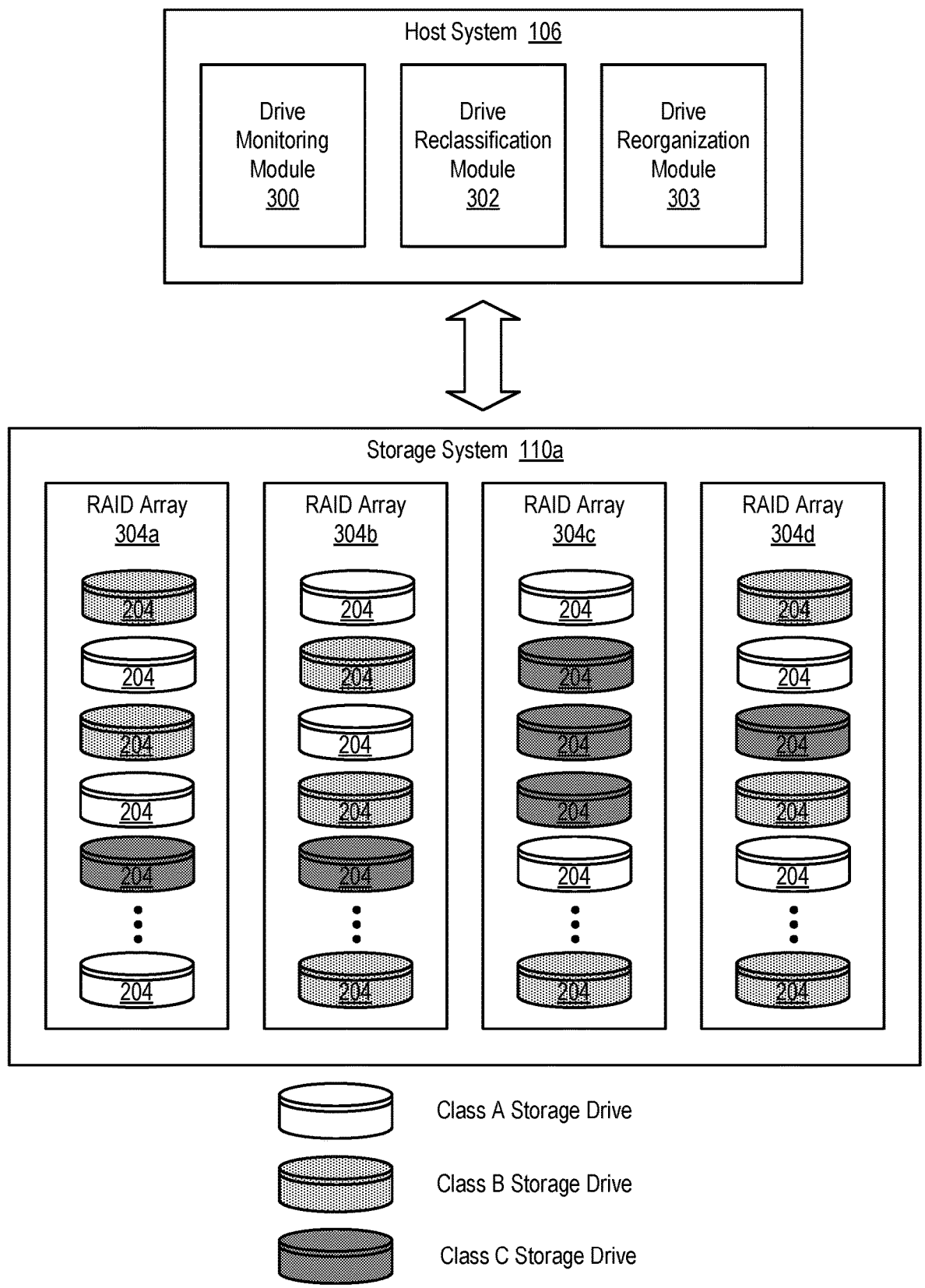
FIG. 4 is a high-level block diagram showing reduction of the storage drives' performance class as the storage drives age.
Figure 5:
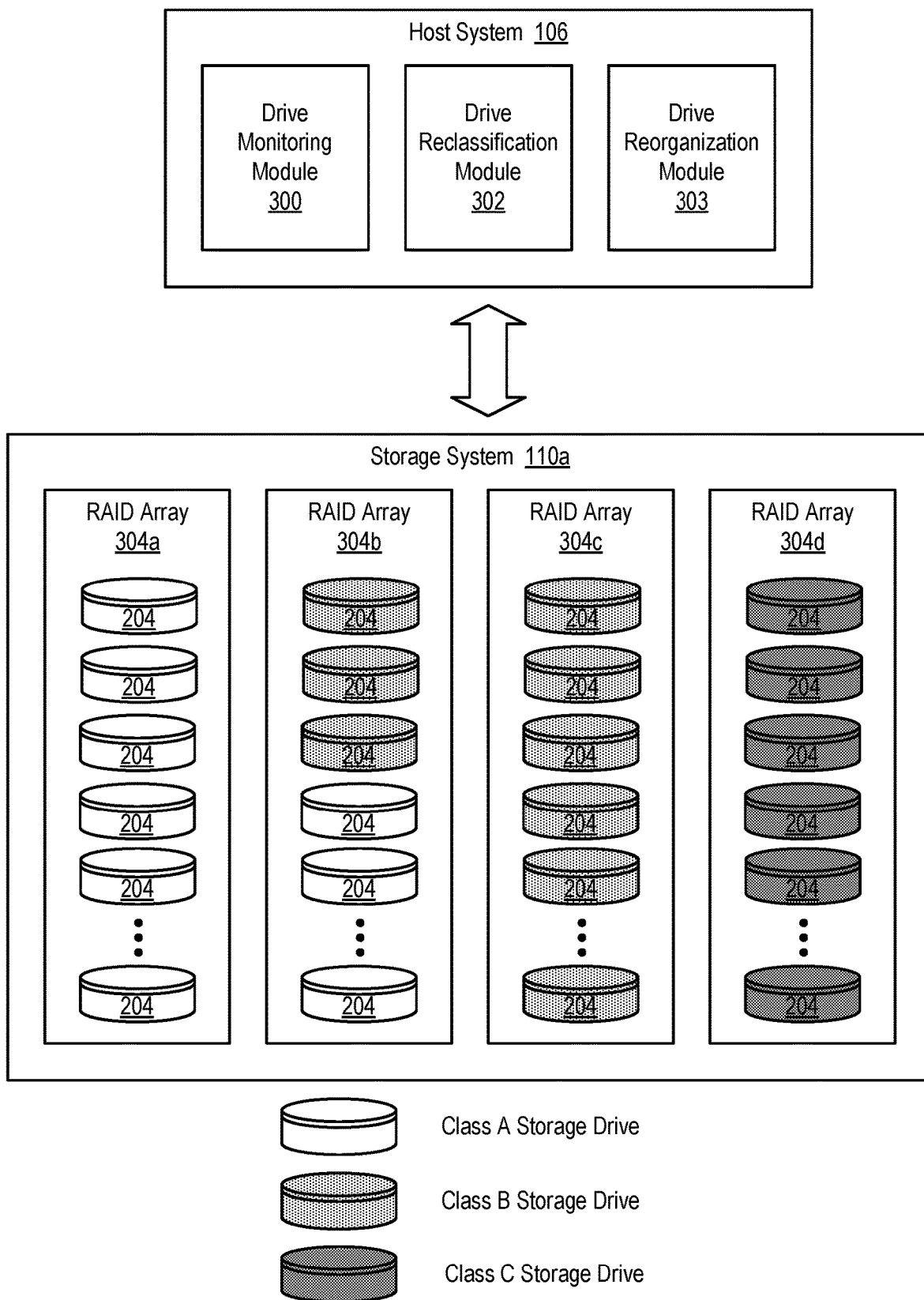
FIG. 5 is a high-level block diagram showing reorganization of the storage drives within RAIDs based on their performance class.

FIG. 4 shows the RAID arrays 304 of FIG. 3 after the storage drives 204 have been reclassified by the drive reclassification module 302. As shown, after some time has passed and various storage drives 204 within the RAID arrays 304 have been replaced or swapped with other storage drives 204 of the same or different performance class, the storage drives 204 in the RAID arrays 304 may have different age and/or wear characteristics. Based on these age and/or wear characteristics, the drive reclassification module 302 may modify the performance class of the storage drives 204 to reflect their age and/or wear. For example, as shown in FIG. 4, the storage environment may contain storage drives 204 that are classified as performance class A, B, or C based on their manufacturer specification or their age and/or wear. This creates a scenario where RAID arrays 304 contain storage drives 204 of differing performance classes, as shown in FIG. 4. In certain embodiments, the storage drive 204 having the lowest performance class may define the performance of the entire RAID array 304. That is, a RAID array 304 may only be able to perform as well as its lowest performing storage drive 204 (i.e., the storage drive 204 with the lowest performance class). Thus, to maximize the performance of a RAID array 304, the RAID array 304 will ideally contain storage drives 204 having the same performance class.

Referring to 5, in order to accomplish this, once the drive reclassification module 302 has modified the performance class of the storage drives 204 to conform to their age and/or wear, the drive reorganization module 303 may reorganize the storage drives 204 within the storage environment. More particularly, the drive reorganization module 303 may attempt to place storage drives 204 of the same performance class in the same RAID arrays 304. Higher performance RAID arrays 304 will ideally contain storage drives 204 of a higher performance class. Similarly, lower performance RAID arrays 304 may contain storage drives 204 of a lower performance class.

In order to reorganize the storage drives 204, the drive reorganization module 303 may swap storage drives 204 between RAID arrays 304 using, for example, a spare storage drive 204 as an intermediate data store to facilitate the swap of data. In certain embodiments, this is accomplished using a smart rebuild process to copy data from one storage drive 204 to another. The smart rebuild process may reduce exposure to data loss by maintaining the ability for a storage drive 204 to be used as a spare even as data is being copied to it. In certain embodiments, when data is copied from a first storage drive 204 to a second storage drive 204 (e.g., a spare storage drive 204), the smart rebuild process may create a bitmap for the first storage drive 204. Each bit may represent a section (e.g., a one megabyte region) of storage space on the first storage drive 204. The smart rebuild process may then begin copying data from the first storage drive 204 to the second storage drive 204. As each section is copied, its associated bit may be recorded in the bitmap.

If a write is received to a section of the first storage drive 204 while the data copy process is ongoing, the smart rebuild process may check the bitmap to determine if data in the associated section has already been copied to the second storage drive 204. If not, the smart rebuild process may simply write the data to the corresponding section of the first storage drive 204. Otherwise, after writing the data to the first storage drive 204, the data may also be copied to the second storage drive 204. Once all sections are copied from the first storage drive 204 to the second storage drive 204, the RAID array 304 may begin to use the second storage drive 204 in place of the first storage drive 204. This frees the first storage drive 204 from the RAID array 304.

Alternatively, the smart rebuild process may utilize a watermark instead of a bitmap to track which data has been copied from a first storage drive 204 to a second storage drive 204. In such an embodiment, sections may be copied in a designated order from a first storage drive 204 to a second storage drive 204. The watermark may track how far the copy process has progressed through the sections. If a write is received to a section of the first storage drive 204 during the copy process, the smart rebuild process may check the watermark to determine if data in the section has already been copied to the second storage drive 204. If not, the smart rebuild process may write the data to the first storage drive 204. Otherwise, after writing the data to the first storage drive 204, the smart rebuild process may also copy the data to the second storage drive 204. Once all sections have been copied from the first storage drive 204 to the second storage drive 204, the RAID array 304 may begin to use the second storage drive 204 in place of the first storage drive 204. This frees the first storage drive 204 from the RAID array 304.

Figure 6:
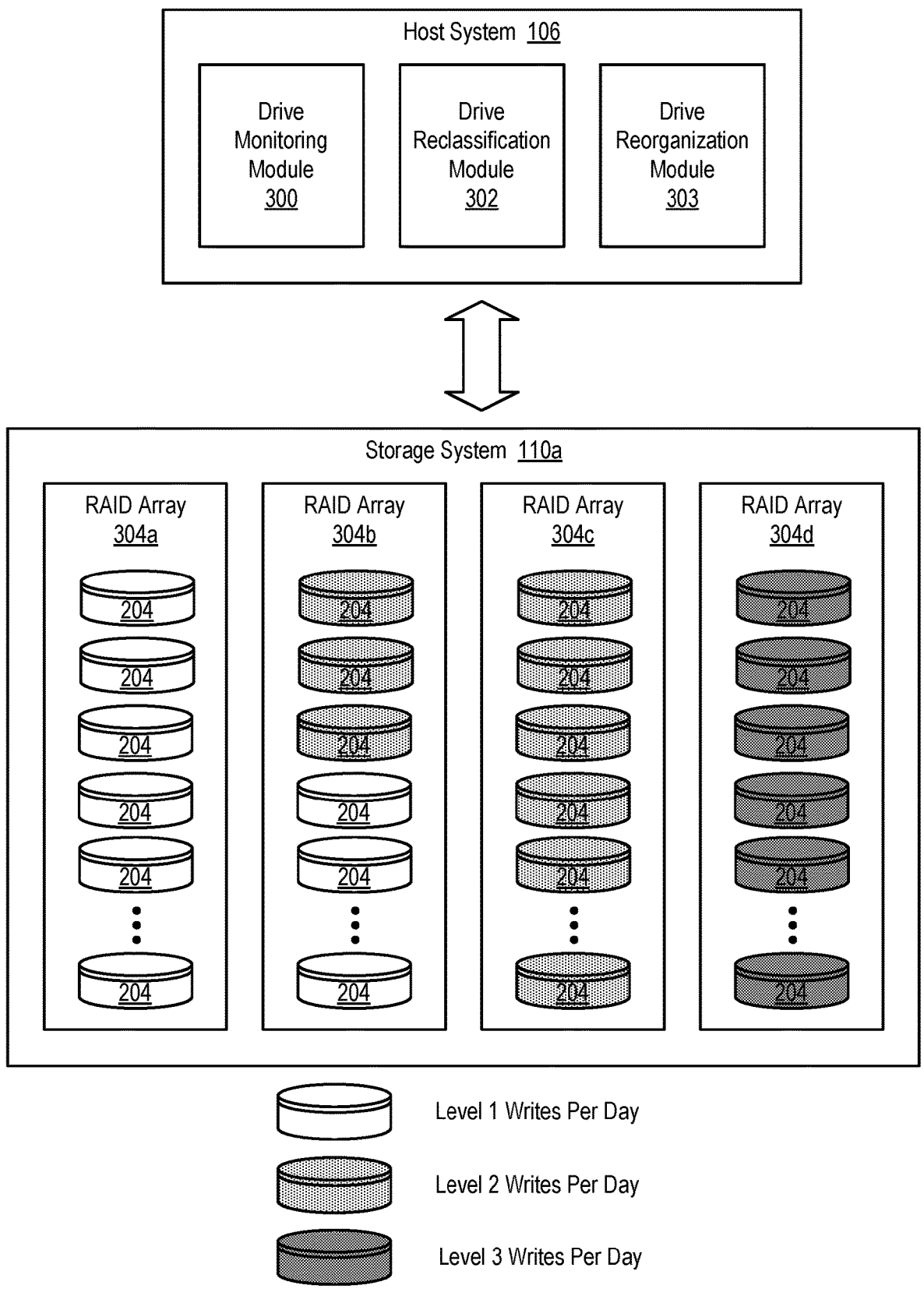
FIG. 6 is a high-level block diagram showing reorganization of the storage drives within RAIDs based on their writes-per-day classification.
Figure 7:
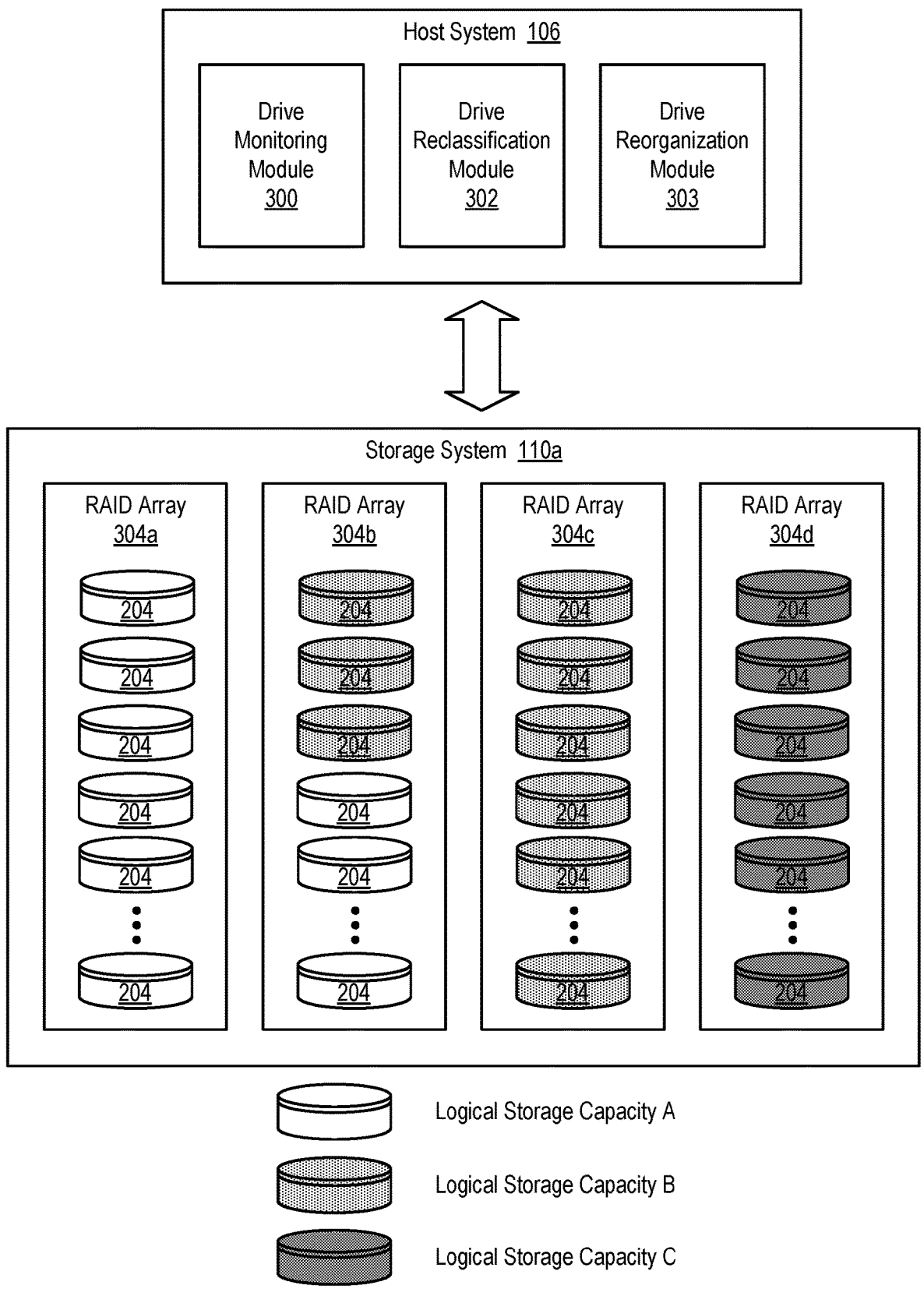
FIG. 7 is a high-level block diagram showing reorganization of the storage drives within RAIDs based on their logical storage capacity.

In other embodiments, the drive reclassification module 302 may change other characteristics of storage drives 204 within a storage environment. For example, the drive reclassification module 302 may modify, based on the age or wear of a storage drive 204, a writes-per-day classification, a logical storage capacity, and/or an amount of overprovisioning associated with a storage drive 204. The drive reorganization module 303 may then reorganize the storage drives 204 within RAID arrays 304 based on their writes-per-day classification, as shown in FIG. 6, or their logical storage capacity, as shown in FIG. 7. Thus, systems and methods in accordance with the invention may monitor various characteristics of storage drives 204, reclassify the storage drives 204 based on their characteristics, and reorganize the storage drives 204 after they have been reclassified. The manner in which this may be accomplished will be described in more detail in association with FIGS. 8 through 13.

Figure 8:
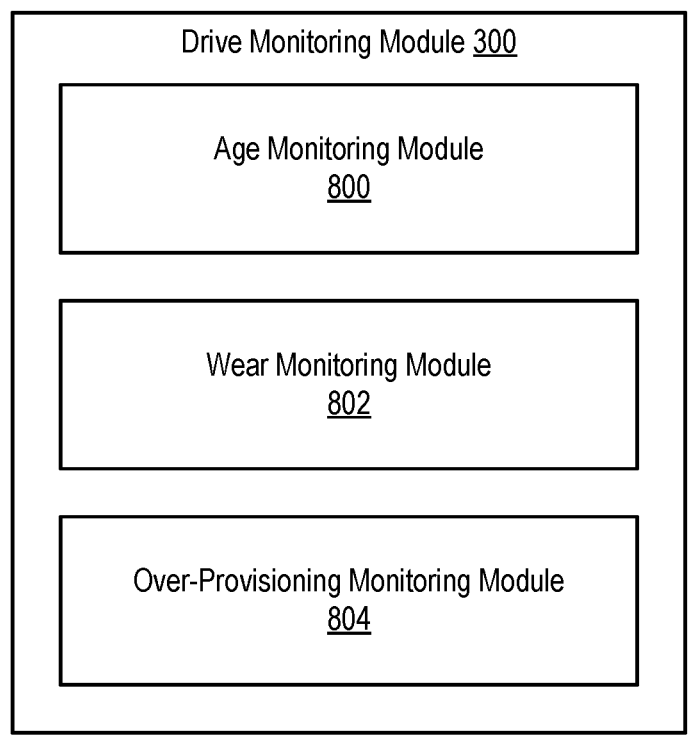
FIG. 8 is a high-level block diagram showing various sub-modules within a drive monitoring module in accordance with the invention.

FIG. 8 is a high-level block diagram showing various sub-modules that may be included within a drive monitoring module 300. The drive monitoring module 300 and associated sub-modules may be implemented in hardware, software, firmware, or combinations thereof. The drive monitoring module 300 and associated sub-modules are presented by way of example and not limitation. More or fewer sub-modules may be provided in different embodiments. For example, the functionality of some sub-modules may be combined into a single or smaller number of sub-modules, or the functionality of a single sub-module may be distributed across several sub-modules.

As shown, the drive monitoring module 300 includes one or more of an age monitoring module 800, wear monitoring module 802, and overprovisioning monitoring module 804. The age monitoring module 800 may be configured to monitor the age of storage drives 204 in a storage environment. In certain embodiments, this may be accomplished by detecting when a storage drive 204 is newly installed in the storage environment and then tracking the amount of time the storage drive 204 is in the storage environment from that point forward.

The wear monitoring module 802, by contrast, may monitor the wear of storage drives 204 in the storage environment. In certain embodiments, wear may be determined from the use of a storage drive 204, such as the amount of I/O that has been driven to the storage drive 204 over its lifetime, the amount of time the storage drive 204 has been active, the storage group (e.g., RAID array 304, storage tier, or workload) the storage drive 204 has been associated with during its use, and/or the like.

The overprovisioning monitoring module 804 may be configured to monitor an amount of overprovisioning that exists within a storage drive 204. Certain storage drives 204, such as solid state storage drives 204 (SSDs), may have a certain percentage of their total storage capacity dedicated to storing data and the remaining percentage kept free in the form of "overprovisioning." This overprovisioning typically improves performance and increases the life of the solid state storage drive 204. As the solid state storage drive 204 ages and/or wears out, storage elements within the solid state storage drive 204 may go bad, which may in turn reduce the amount of overprovisioning within the storage drive 204. This may reduce the performance and/or life of the solid state storage drive 204.

Figure 9:
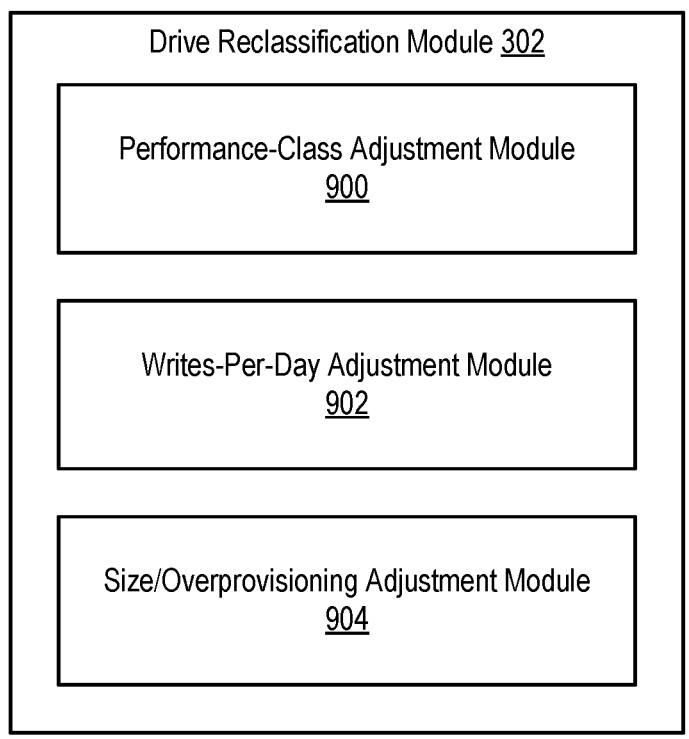
FIG. 9 is a high-level block diagram showing various sub-modules within a reclassification module in accordance with the invention.

FIG. 9 is a high-level block diagram showing various sub-modules that may be included within the drive reclassification module 302 previously described. As shown, the drive reclassification module 302 may include one or more of a performance-class adjustment module 900, writes-per-day adjustment module 902, and size/overprovisioning adjustment module 904. The performance-class adjustment module 900 may be configured to adjust the performance class of a storage drive 204 depending on characteristics (e.g., age and/or wear) of the storage drive 204 that are detected by the drive monitoring module 300. In certain embodiments, the performance-class adjustment module 900 may adjust the performance class in various discrete steps. For example, the performance-class adjustment module 900 may reduce the performance class from performance class A to performance class B, and from performance class B to performance class C, depending on the age or wear of the storage drive 204.

The writes-per-day adjustment module 902 may be used to adjust a writes-per-day classification associated with a storage drive 204. Based on the age, wear, and/or amount of overprovisioning that is associated with a storage drive 204, the writes-per-day adjustment module 902 may reduce the writes-per-day classification associated with a storage drive 204. In certain embodiments, this may occur in discrete steps. For example, the writes-per-day classification may drop from a first level (e.g., 200 GB/day) to a second level (150 GB/day), and then from the second level to a third level (e.g., 100 GB/day), and so forth, in various discrete steps depending on the characteristics (e.g., amount of overprovisioning, age, etc.) associated with the storage drive 204.

The size/overprovisioning adjustment module 904 may be configured to adjust a logical storage capacity and/or amount of overprovisioning associated with a storage drive 204. As mentioned above, as a storage drive 204 (e.g., a solid state storage drive 204) ages or is utilized, sectors or storage elements in the storage drive 204 may go bad. When the amount of overprovisioning within the storage drive 204 is reduced to a certain level or threshold, the size/overprovisioning adjustment module 904 may adjust the logical storage capacity and/or amount of overprovisioning in the storage drive 204. For example, the size/overprovisioning adjustment module 904 may reduce the logical storage capacity of the storage drive 204 in order to increase the amount of overprovisioning. This may improve performance and/or increase the useful life of the storage drive 204. In certain embodiments, this may occur in various discrete steps. For example, the size/overprovisioning adjustment module 904 may reduce the logical storage capacity of the storage drive 204 from size A (e.g., 900 GB) to size B (e.g., 800 GB), from size B to size C (e.g., 700 GB), and so forth, in various discrete steps as the storage drive 204 ages and/or wears out. As will be explained in more detail hereafter, in certain cases, when the logical storage capacity of a storage drive 204 is reduced, some data may need to be migrated off of the storage drive 204 to facilitate the reduction of logical storage capacity.

Figure 10:
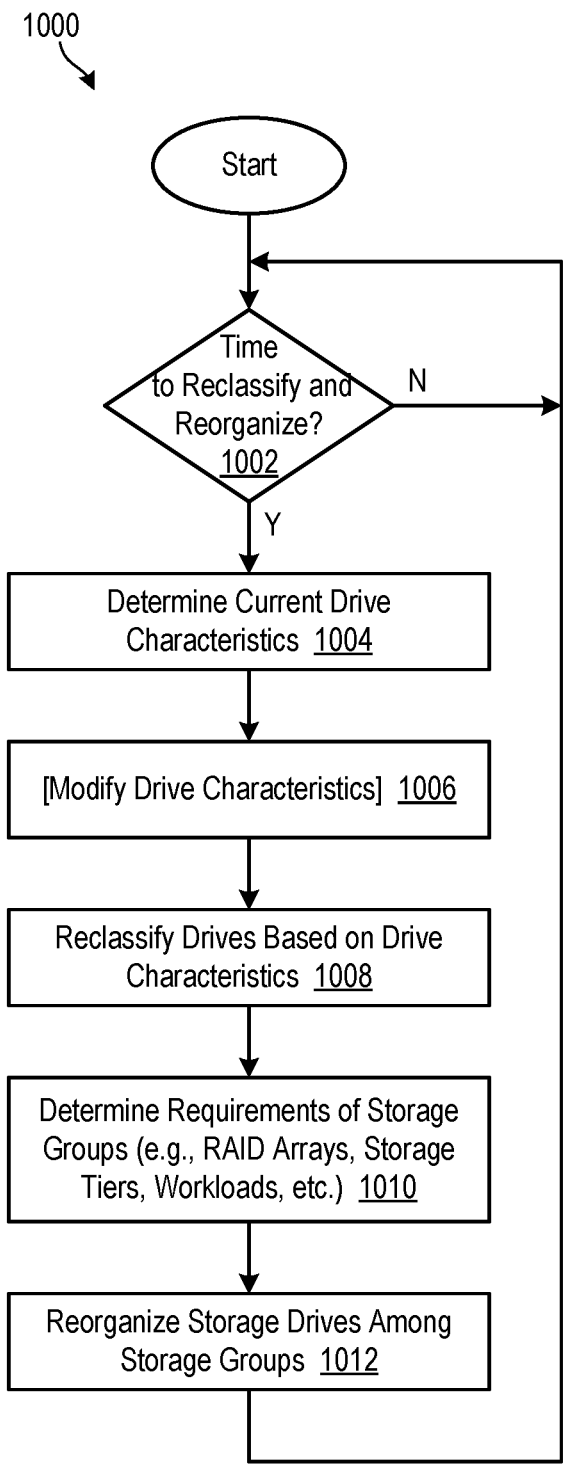
FIG. 10 is a flow diagram showing one embodiment of a method for reorganizing storage drives based on drive characteristics.

Referring to FIG. 10, a flow diagram showing one embodiment of a method 1000 for reorganizing storage drives 204 based on drive characteristics is illustrated. This method 1000 is intended to broadly encompass the more particular methods illustrated in FIGS. 11 through 13.

As shown, the method 1000 initially determines 1002 whether it is time to reclassify and reorganize storage drives 204 within a storage environment. In certain embodiments, the method 1000 is intended to be executed periodically, such as every week, every month, or every several months.

The step 1002 may be configured to determine if and when the method 1000 should be executed.

If it is time to reclassify and reorganize storage drives 204 within the storage environment, the method 1000 determines 1004 drive characteristics, such as the age, wear, amount of overprovisioning, or the like, of the storage drives 204 in the storage environment. In certain embodiments, the method 1000 actually modifies drive characteristics once certain characteristics are observed. For example, in the event the amount of overprovisioning in a storage drive 204 drops below a specified level, the method 1000 may reduce the logical storage capacity and thereby increase the amount of overprovisioning of the storage drive 204.

The method 1000 then reclassifies 1008 the storage drives 204 within the storage environment based on the determined characteristics. For example, if a storage drive 204 has reached a certain age, the method 1000 may reclassify 1008 the storage drive 204 from performance class A to performance class B, or from performance class B to performance class C. In another example, if a storage drive 204 has reached a certain age or amount of wear, the method 1000 may reclassify 1008 the storage drive 204 from a first writes-per-day classification to a second writes-per-day classification. In yet another example, if a storage drive 204 has reached a certain age or amount of wear, the method 1000 may reclassify 1008 the storage drive 204 from having a first logical storage capacity to having a second logical storage capacity.

The method 1000 then determines 1010 requirements of certain storage groups (e.g., RAID arrays 304, storage tiers, storage drives 204 supporting certain workloads, etc.) that contain the storage drives 204. For example, the method 1000 may determine the performance requirements of RAID arrays 304 within the storage environment. Based on the requirements of the storage groups and the classifications of the storage drives 204, the method 1000 reorganizes 1012 storage drives 204 within the storage groups. For example, the method 1000 may attempt to reorganize 1012 storage drives 204 in RAID arrays 304 such that higher performance RAID arrays 304 or storage tiers contain storage drives 204 of a higher performance class (e.g., performance class A), and lower performance RAID arrays 304 or storage tiers contain storage drives 204 of a lower performance class. In certain embodiments, this may be accomplished by swapping storage drives 204 in the RAID arrays 304 or storage tiers using a smart rebuild process that swaps data between the storage drives 204.

Figure 11:
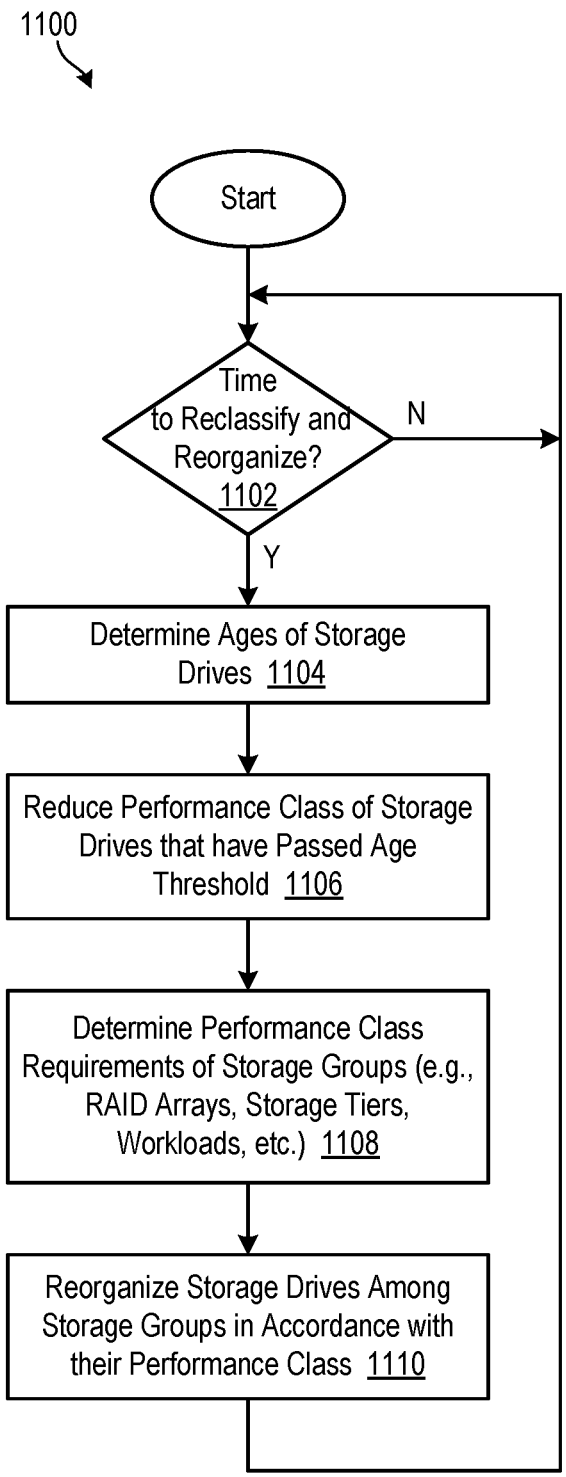
FIG. 11 is a flow diagram showing one embodiment of a method for reorganizing storage drives based on their performance class.

Referring to FIG. 11, one embodiment of a method 1100 for reorganizing storage drives 204 based on their performance class is illustrated. If, at step 1102, it is time to reclassify and reorganize storage drives 204 within the storage environment, the method 1100 determines 1104 the age of storage drives 204 in the storage environment. The method 1100 then reduces 1106 the performance class of storage drives 204 whose age has reached a designated threshold. For example, a storage drive 204 with a three-year projected lifespan may be reduced 1106 from performance class A to performance class B once it has reached one year of age. The same storage drive 204 may be reduced 1106 from performance class B to performance class C when it has reached two years of age.

The method 1100 then determines 1108 the requirements of various storage groups (e.g., RAID arrays 304, storage tiers, storage drives 204 supporting certain workloads, etc.) in the storage environment. For example, the method 1100 may determine that a first RAID array 304 or storage tier in the storage environment requires higher performance and thus higher performance storage drives 204 and a second RAID array 304 or storage tier in the storage environment can utilize lower performance storage drives 204. Based on the requirements of the storage groups and the characteristics of the storage drives 204, the method 1100 reorganizes 1110 storage drives 204 within the storage groups. For example, the method 1100 may place, as much as possible, storage drives 204 of the same performance class in the same storage groups. In certain embodiments, this may be accomplished by swapping storage drives 204 in the RAID arrays 304 or storage tiers using a smart rebuild process.

In certain embodiments, the reorganization step 1110 works as follows, assuming storage drives 204 are reorganized according to their performance class, the storage drives 204 are classified as either performance class A, B, or C, and the storage groups are RAID arrays 304: The reorganization step 1110 may first generate a "count" of all storage drives 204 in the storage environment of performance class A. The reorganization step 1110 may then find the RAID array 304 in the storage environment with the most performance class A storage drives 204. The reorganization step 1110 reduces the "count" by the number of performance class A storage drives 204 in the RAID array 304. The reorganization step 1110 then swaps performance class A storage drives 204 from other RAID arrays 304 into the RAID array 304 using a smart rebuild process until the RAID array 304 contains all performance class A storage drives 204. The reorganization step 1110 reduces the "count" by the number of storage drives 204 that are swapped. If the "count" is zero, then the reorganization for storage drives 204 of performance class A stops. Otherwise the reorganization step 1110 repeats for the RAID array 304 with the next highest number of performance class A storage drives 204 or until the "count" goes to zero. This reorganization step 1110 is repeated for performance class B and performance class C storage drives 204. The reorganization step 1110 will place, as much as possible, storage drives 204 of the same performance class in the same RAID arrays 304.

Figure 12:
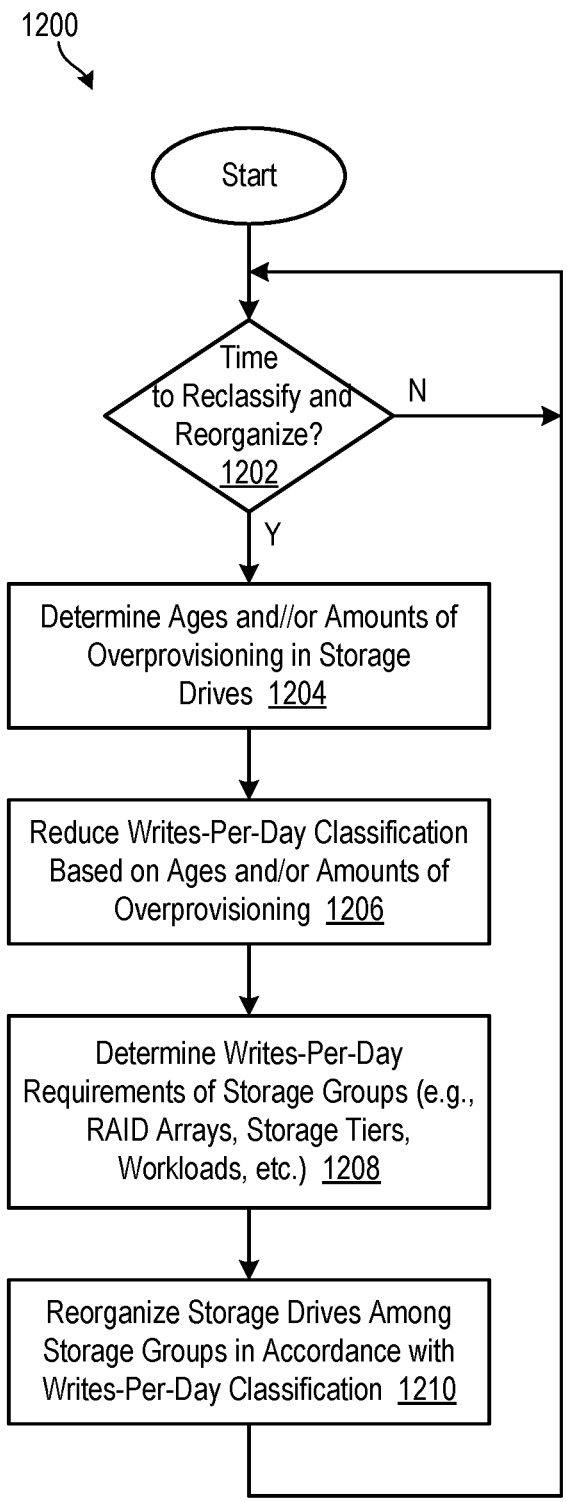
FIG. 12 is a flow diagram showing one embodiment of a method for reorganizing storage drives based on their writes-per-day classification.

Referring to FIG. 12, one embodiment of a method 1200 for reorganizing storage drives based on their writes-per-day classification is illustrated. If, at step 1202, it is time to reclassify and reorganize storage drives 204 within the storage environment, the method 1200 determines 1204 the age and/or amount of overprovisioning of storage drives 204 in the storage environment. The method 1200 then reduces 1206 the writes-per-day classification of storage drives 204 whose age or amount of overprovisioning has reached a designated threshold. For example, a storage drive 204 may be reduced 1206 from a level 1 writes-per-day classification to a level 2 writes-per-day classification once the storage drive 204 has reached a first age (e.g., one year) or specified amount of overprovisioning (less than ten percent overprovisioning, for example). Similarly, the storage drive 204 may be reduced 1206 from a level 2 writes-per-day classification to a level 3 writes-per-day classification once the storage drive 204 has reached a second age (e.g., two years) or once again reached the specified amount of overprovisioning.

The method 1200 then determines 1208 the requirements of various storage groups (e.g., RAID arrays 304, storage tiers, storage drives 204 supporting certain workloads, etc.) in the storage environment. For example, the method 1200 may determine that a first RAID array 304 or storage tier in the storage environment requires higher performance and thus storage drives 204 of a higher writes-per-day classification and a second RAID array 304 or storage tier in the storage environment can utilize storage drives 204 having a lower writes-per-day classification. Based on the requirements of the storage groups and the writes-per-day classifications of the storage drives 204, the method 1200 reorganizes 1210 storage drives 204 within the storage groups. For example, the method 1200 may place, as much as possible, storage drives 204 of the same writes-per-day classification in the same storage groups. In certain embodiments, this may be accomplished by swapping storage drives 204 in the RAID arrays 304 or storage tiers using a smart rebuild process. In certain embodiments, the reorganization step 1210 may work in much the same way as the reorganization step 1110 described in association with FIG. 11.

Figure 13:
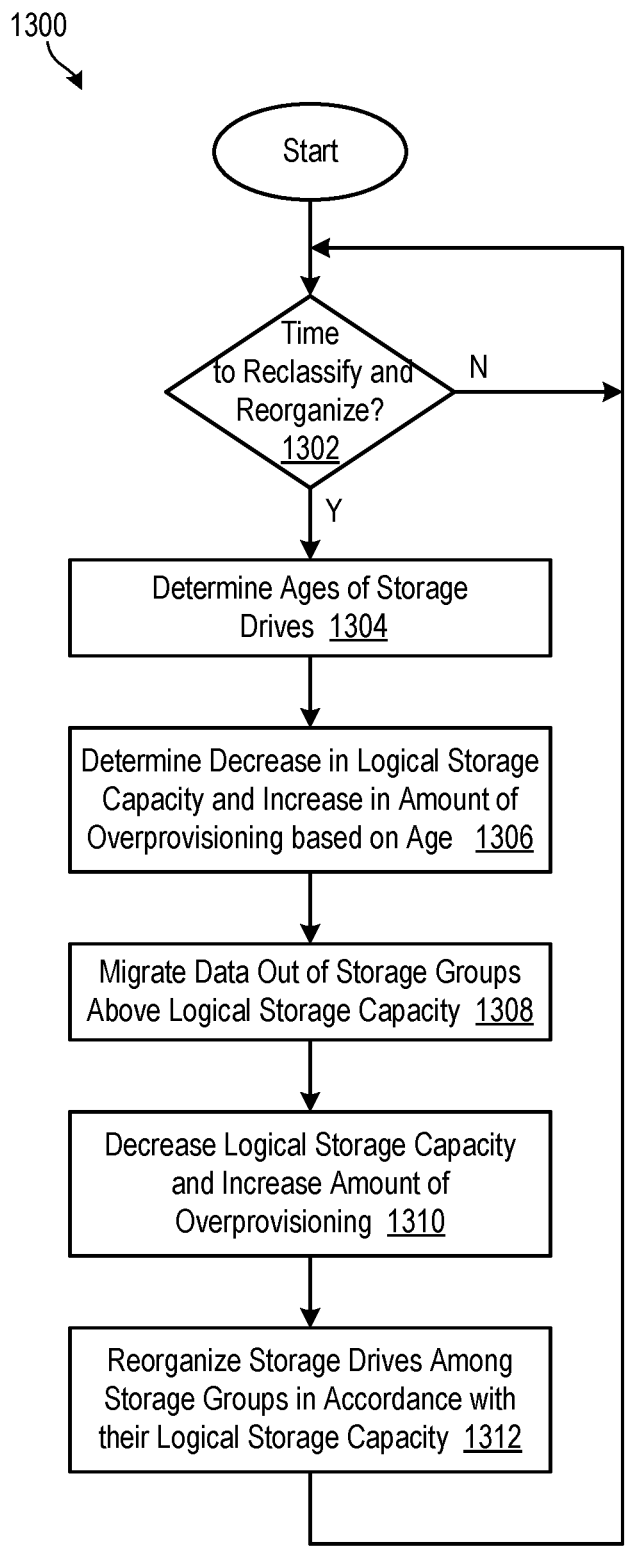
FIG. 13 is a flow diagram showing one embodiment of a method for reorganizing storage drives based on their logical storage capacity.

Referring to FIG. 13, one embodiment of a method 1300 for reorganizing storage drives based on their logical storage capacity is illustrated. If, at step 1302, it is time to reclassify and reorganize storage drives 204 within the storage environment, the method 1300 determines 1304 the age of storage drives 204 in the storage environment. The method 1300 then determines 1306, based on the age of the storage drives 204, an appropriate decrease in the logical storage capacity and an increase in the amount of overprovisioning for the storage drives 204. If a storage drive 204 contains an amount of data that exceeds what can be accommodated in the newly determined logical storage capacity, the method 1300 migrates 1308 the data out of the storage drive 204 to another location. The storage drives 204 may then be reconfigured to dedicate the released logical storage capacity to overprovisioning. The method 1300 then decreases 1310 the logical storage capacity and increases 1310 the amount of overprovisioning in the storage drives 204 in accordance with the amounts determined at step 1306.

The method 1300 then reorganizes 1310 storage drives 204 within storage groups (e.g., RAID arrays 304, storage tiers, etc.). For example, the method 1300 may place, as much as possible, storage drives 204 of the same logical storage capacity in the same storage groups. In certain embodiments, this may be accomplished by swapping storage drives 204 in the storage groups using a smart rebuild process. In certain embodiments, the reorganization step 1310 may work in much the same way as the reorganization steps 1110, 1210 described in association with FIGS. 11 and 12.

The flowcharts and/or block diagrams in the Figures illustrate the architecture, functionality, and operation of possible implementations of systems, methods, and computer-usable media according to various embodiments of the present invention. In this regard, each block in the flowcharts or block diagrams may represent a module, segment, or portion of code, which comprises one or more executable instructions for implementing the specified logical function (s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, may be implemented by special purpose hardware-based systems that perform the specified functions or acts, or combinations of special purpose hardware and computer instructions.

The invention claimed is:

1. A method for dynamically altering a writes-per-day classification of a plurality of storage drives, the method comprising:
    monitoring, within a storage environment, an amount of overprovisioning of a plurality of storage drives that changes with the age and/or wear of the storage drives, each storage drive having a writes-per-day classification associated therewith;
    establishing a plurality of discrete classification levels, wherein each discrete classification level is associated with a different writes-per-day classification;
    periodically performing the following:
        based on the amount of overprovisioning, modifying the writes-per-day classification of the storage drives such that at least one storage drive of the plurality is reclassified from one discrete classification level to another; and
        reorganizing the storage drives within various storage groups based on their discrete classification levels.

2. The method of claim 1, wherein the storage groups are RAID arrays.

3. The method of claim 1, wherein the storage groups are storage tiers in a tiered storage environment.

4. The method of claim 1, wherein the storage groups are groups of storage drives configured to support a certain I/O workload.

5. The method of claim 1, wherein the amount of overprovisioning changes with the age of the storage drives.

6. The method of claim 1, wherein the amount of overprovisioning changes with the wear of the storage drives.

7. The method of claim 1, wherein reorganizing the storage drives comprises placing, as much as possible, storage drives of the same discrete classification levels in the same storage groups.

8. A computer program product for dynamically altering a writes-per-day classification of a plurality of storage drives, the computer program product comprising a computer-readable medium having computer-usable program code embodied therein, the computer-usable program code configured to perform the following when executed by at least one processor:
    monitor, within a storage environment, an amount of overprovisioning of a plurality of storage drives that changes with the age and/or wear of the storage drives, each storage drive having a writes-per-day classification associated therewith;
    establish a plurality of discrete classification levels, wherein each discrete classification level is associated with a different writes-per-day classification;
    periodically perform the following:
        based on the amount of overprovisioning, modify the writes-per-day classification of the storage drives such that at least one storage drive of the plurality is reclassified from one discrete classification level to another; and
        reorganize the storage drives within various storage groups based on their discrete classification levels.

9. The computer program product of claim 8, wherein the storage groups are RAID arrays.

10. The computer program product of claim 8, wherein the storage groups are storage tiers in a tiered storage environment.

11. The computer program product of claim 8, wherein the storage groups are groups of storage drives configured to support a certain I/O workload.

12. The computer program product of claim 8, wherein the amount of overprovisioning changes with the age of the storage drives.

13. The computer program product of claim 8, wherein the amount of overprovisioning changes with the wear of the storage drives.

14. The computer program product of claim 8, wherein reorganizing the storage drives comprises placing, as much as possible, storage drives of the same discrete classification levels in the same storage groups.

15. A system for dynamically altering a writes-per-day classification of a plurality of storage drives, the system comprising:
- at least one processor;
- at least one memory device coupled to the at least one processor and storing instructions for execution on the at least one processor, the instructions causing the at least one processor to:
    - monitor, within a storage environment, an amount of overprovisioning of a plurality of storage drives that changes with the age and/or wear of the storage drives, each storage drive having a writes-per-day classification associated therewith;
    - establish a plurality of discrete classification levels, wherein each discrete classification level is associated with a different writes-per-day classification;
    - periodically perform the following:
        - based on the amount of overprovisioning, modify the writes-per-day classification of the storage drives such that at least one storage drive of the plurality is reclassified from one discrete classification level to another; and
        - reorganize the storage drives within various storage groups based on their discrete classification levels writes.

16. The system of claim 15, wherein the storage groups are RAID arrays.

17. The system of claim 15, wherein the storage groups are storage tiers in a tiered storage environment.

18. The system of claim 15, wherein the storage groups are groups of storage drives configured to support a certain I/O workload.

19. The system of claim 15, wherein the amount of overprovisioning changes with the age of the storage drives.

20. The system of claim 15, wherein the amount of overprovisioning changes with the wear of the storage drives.

* * * * *